US010443812B2

(12) United States Patent
Meyers et al.

(10) Patent No.: US 10,443,812 B2
(45) Date of Patent: Oct. 15, 2019

(54) VEHICLE NAVIGATIONAL SYSTEM

(71) Applicant: General Electric Company, Schenectady, NY (US)

(72) Inventors: Mark Marshall Meyers, Niskayuna, NY (US); Loucas Tsakalakos, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 185 days.

(21) Appl. No.: 15/497,552

(22) Filed: Apr. 26, 2017

(65) Prior Publication Data
US 2017/0358220 A1 Dec. 14, 2017

Related U.S. Application Data

(60) Provisional application No. 62/348,291, filed on Jun. 10, 2016.

(51) Int. Cl.
*F21V 5/00* (2018.01)
*F21V 5/08* (2006.01)
(Continued)

(52) U.S. Cl.
CPC ............. *F21V 5/007* (2013.01); *F21K 9/68* (2016.08); *F21K 9/69* (2016.08); *F21K 9/90* (2013.01);
(Continued)

(58) Field of Classification Search
CPC ..... F21K 9/68; F21K 9/69; F21K 9/90; F21V 5/007; F21V 13/04; F21V 14/04;
(Continued)

(56) References Cited

U.S. PATENT DOCUMENTS 4,862,164 A 8/1989 Croley et al.
6,783,260 B2 8/2004 Machi et al.
(Continued)

FOREIGN PATENT DOCUMENTS

EP 3009856 A1 4/2016

OTHER PUBLICATIONS

Reinhard Drews et al. , "A Spatially Adjusted Elevation Model in Dronning Maud Land, Antarctica, Based on Differential SAR Interferometry", IEEE Transactions on Geosciences and Remote Sensing (vol. 47 , Issue: 8 ) , pp. 2501-2509, Apr. 28, 2009.
(Continued)

*Primary Examiner* — William J Carter
(74) *Attorney, Agent, or Firm* — Christopher R. Carroll; The Small Patent Law Group LLC

(57) ABSTRACT

A laser navigational system for a vehicle having a lighting assembly configured for emission of light. A lens array assembly receives incoming light from the lighting assembly and changes the direction of the incoming light received from the lighting assembly such that the outgoing light emanating from the lens array assembly is collimated in a first direction but diverges along a different, second direction. A scanning unit aligns with the lighting assembly to direct the collimated beam in two orthogonal directions. The lighting assembly, the lens array assembly and the scanning unit are configured to direct the light to form a visual beacon that guides navigation of the vehicle to a location.

15 Claims, 11 Drawing Sheets

(51) Int. Cl.

| | |
|---|---|
| *F21V 13/04* | (2006.01) |
| *F21V 14/04* | (2006.01) |
| *G02B 27/42* | (2006.01) |
| *G02B 3/00* | (2006.01) |
| *G02B 19/00* | (2006.01) |
| *F21K 9/68* | (2016.01) |
| *F21K 9/69* | (2016.01) |
| *F21K 9/90* | (2016.01) |
| *G08G 5/00* | (2006.01) |
| *H01S 5/00* | (2006.01) |
| *H01S 5/024* | (2006.01) |
| *H01S 5/0683* | (2006.01) |
| *F21Y 115/30* | (2016.01) |
| *F21W 111/06* | (2006.01) |
| *H01S 5/40* | (2006.01) |

(52) U.S. Cl.
CPC ............... *F21V 5/08* (2013.01); *F21V 13/04* (2013.01); *F21V 14/04* (2013.01); *G02B 3/005* (2013.01); *G02B 3/0012* (2013.01); *G02B 19/0009* (2013.01); *G02B 19/0057* (2013.01); *G02B 27/425* (2013.01); *G08G 5/0047* (2013.01); *H01S 5/0071* (2013.01); *H01S 5/02415* (2013.01); *H01S 5/0683* (2013.01); *F21W 2111/06* (2013.01); *F21Y 2115/30* (2016.08); *H01S 5/005* (2013.01); *H01S 5/4025* (2013.01)

(58) Field of Classification Search
CPC ... F21V 5/00; G02B 19/0009; G02B 19/0057; H01S 5/0071; H01S 5/02415; H01S 5/0683

USPC .......................................... 362/244, 326, 332
See application file for complete search history.

(56) References Cited

U.S. PATENT DOCUMENTS

| | | | |
|---|---|---|---|
| 6,853,490 B2* | 2/2005 | Wang | B41J 2/451 |
| | | | 359/621 |
| 7,475,852 B2 | 1/2009 | Hewitt et al. | |
| 7,705,879 B2 | 4/2010 | Kerr et al. | |
| 8,301,027 B2* | 10/2012 | Shaw | H01S 5/423 |
| | | | 398/118 |
| 8,314,928 B2 | 11/2012 | Tzidon et al. | |
| 8,526,811 B2* | 9/2013 | Xie | H04B 10/564 |
| | | | 398/25 |
| 9,170,435 B2* | 10/2015 | Lopez | G02F 1/01 |
| 2012/0223255 A1* | 9/2012 | Walker | B64F 1/20 |
| | | | 250/495.1 |
| 2015/0241562 A1 | 8/2015 | Goldberg et al. | |

OTHER PUBLICATIONS

Yvonne Gibbs, "Beamed Laser Power for UAVs", NASA Armstrong Fact Sheet , Feb. 28, 2014.
Gail Overton, "Infrared cameras and LEDs allow in-flight UAV refuelling" , Laserfocusworld , http://www.laserfocusworld.com/articles/2015/05/infrared-cameras-and-leds-allow-in-flight-uav-refueling.html, May 5, 2015.

* cited by examiner

VEHICLE NAVIGATIONAL SYSTEM

CROSS-REFERENCE TO RELATED APPLICATIONS

This Non-Provisional application claims priority to U.S. Provisional Application Ser. No. 62/348,291 filed Jun. 10, 2016, the entire disclosure of which is incorporated herein by reference.

BACKGROUND

Navigating and controlling vehicles, such as an aircraft, is a difficult and complicated process. Whether the aircraft is operated manually by a pilot or operated automatically, such as an unmanned aerial vehicle, operation of the aircraft can be complicated by many factors. Poor weather conditions, such as storms, fog, hail, downdrafts, darkness, and high winds, reduce visibility and impact the performance of the aircraft. Operation of the aircraft can also be affected by the specific geography and surrounding of the location of operation. For example, operating an aircraft in crowded or high risk environments, such as an emergency response location, a ship, an offshore oil drilling platform, requires precise and accurate control to reduce safety risks, such as collision. This is especially true when the aircraft is performing sophisticated maneuvers such as landing, aerial docking, or aerial refueling.

To increase the safety of aircraft operation, systems have been developed to assist with navigation, control, landing, and aerial refueling. These systems include global positioning systems (GPS), radio navigational systems, inertial navigation systems (INS), non-directional beacons (NBD), optical navigation systems, and laser navigation systems. Laser navigation systems have certain advantages over other types of systems. For instance, laser navigation systems are self-contained, and operate in poor weather conditions and environments where other systems cannot operate.

However, existing laser navigation systems are too large for some applications in particular mobile applications. Typically, navigation beacons for aerial applications use intensity modulated 405 nm laser diodes, or a 1.55 um fiber laser with bulk optics for beam shaping and a two axis galvanometer for beam deflection. These systems tend to be in one or two large boxes to contain the laser sources and a separate unit for the bulk optics and control electronics.

In addition, the laser power generated is too low to transmit navigation information to the desired distances, such as 6,000 feet or more. Generally, existing systems cannot generate a tight enough formed beam to achieve signal levels on the outer periphery of the pattern.

Also, the optics in existing systems are not capable of maintaining proper performance over long distances, which reduces the operational range of the system. Typically, the beam forming optics are incapable of maintaining the correct shape over long propagation distances, especially for the widely divergent sections of the beam. If the beam is aberrated or distorted, the signal intensity that the incoming aircraft receives is reduced, which degrades the SNR, and reduces the range over which the system can operate.

BRIEF DESCRIPTION

In one embodiment, a navigational system for a vehicle includes a lighting assembly configured for emission of light. A lens array assembly is configured to receive incoming light from the lighting assembly and change the direction of the incoming light received from the lighting assembly such that the outgoing light emanating from the lens array assembly is collimated in a first direction but diverges along a different, second direction. A scanning unit in alignment with the lighting assembly and is configured to direct the collimated beam in two orthogonal directions. The lighting assembly, the lens array assembly and the scanning unit are configured to direct the light to form a visual beacon that guides navigation of the vehicle to a location.

In one embodiment, a lighting assembly for a navigational system for a vehicle, includes a plurality of laser diodes configured for emission of light. A plurality of photo diodes electrically connects to the laser diodes. A controller electrically connects to the laser diodes and the photo diodes. A lens array assembly configured to receive incoming light from the laser diodes and change directions of the incoming light received from the laser diodes such that the outgoing light emanating from the lens array assembly is collimated in a first direction but diverges along a different, second direction.

In one embodiment, a method includes emitting a light from an array of laser diodes, receiving the incoming light from the array of laser diodes by an array of lens elements, and changing the direction of the incoming light into an outgoing light that is collimated in a first direction but diverges along a different, second direction. The array of laser diodes, the lens array assembly and the scanning unit are configured to direct the light to form a visual beacon that guides navigation of the vehicle to a location.

In one embodiment, a method includes bonding a controller to an interposer having electrical contacts coupled by traces. A plurality of laser diodes is bonded onto the interposer. A laser diode is bonded to the interposer and electrically connected through the electrical contacts and traces to the controller. A plurality of photo diodes is bonded to the interposer and electrically connected through the electrical contacts and traces to the controller. A thermal management layer is bonded to the interposer. The interposer is mounted to an optical bench. A lens array assembly is mounted to the optical bench to receive incoming light from the laser diode and change the direction of the incoming light received from the laser diode. The outgoing light emanating from the lens array assembly is a beam collimated in a first direction but diverging along a different second direction. The optical bench mounts to a heat sink. The scanning unit mounts to the heat sink in alignment with the lens array assembly for direction of the collimated beam in two orthogonal directions. The scanning unit is electrically connected to the controller. The lighting assembly is at least partially covered by an opto-mechanical housing.

BRIEF DESCRIPTION OF THE DRAWINGS

The present inventive subject matter will be better understood from reading the following description of non-limiting embodiments, with reference to the attached drawings, wherein below.

DETAILED DESCRIPTION

Figure 1:
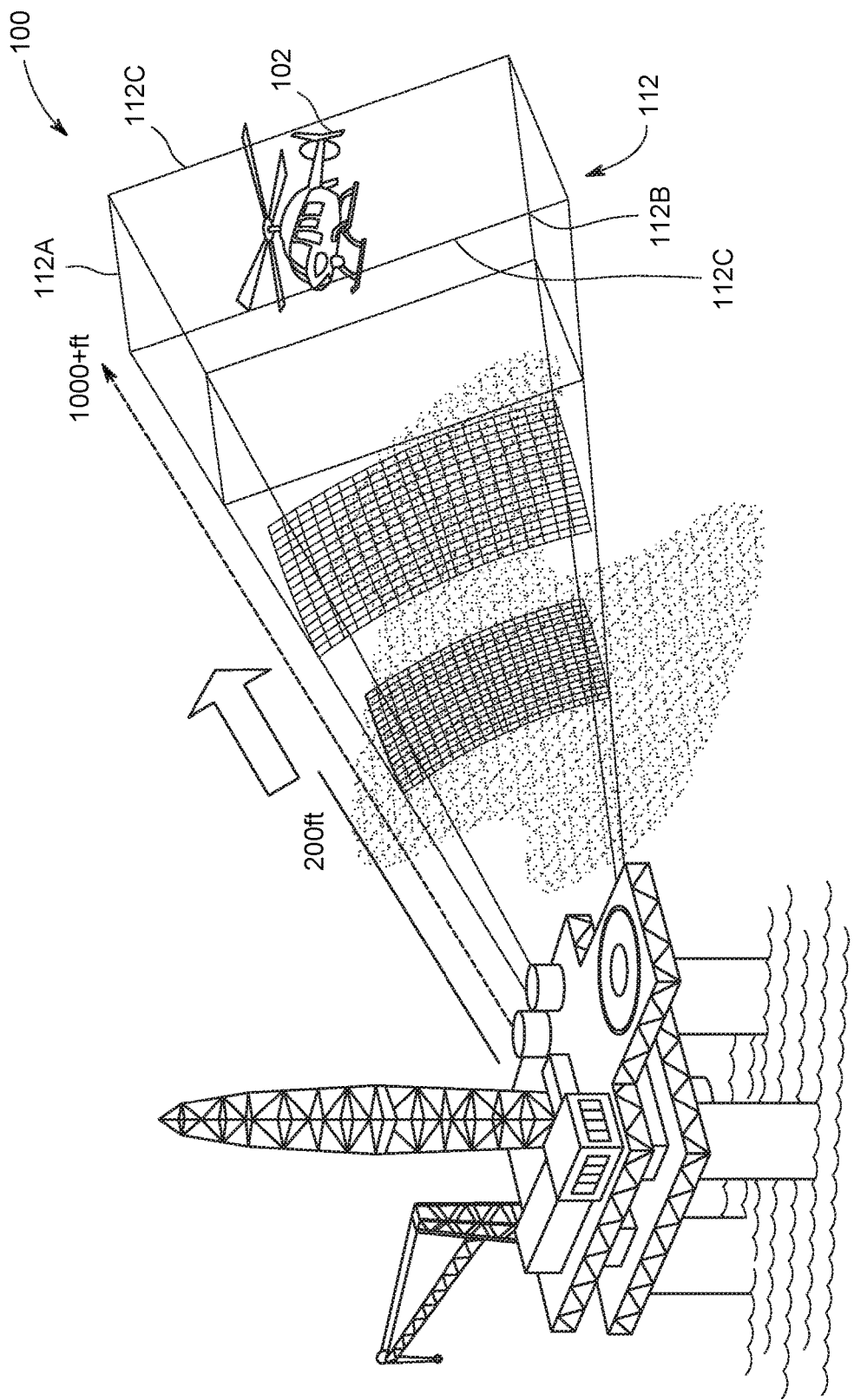
FIG. 1 illustrates one example of a navigational system guiding a vehicle according to an embodiment.

The following detailed description illustrates the inventive subject matter by way of example and not by way of limitation. The description enables one of ordinary skill in the art to make and use the inventive subject matter, describes several embodiments of the inventive subject matter, as well as adaptations, variations, alternatives, and uses of the inventive subject matter. Additionally, it is to be understood that the inventive subject matter is not limited in its application to the details of construction and the arrangements of components set forth in the following description or illustrated in the drawings. The inventive subject matter is capable of other embodiments and of being practiced or being carried out in various ways. Also, it is to be understood that the phraseology and terminology used herein is for the purpose of description and should not be regarded as limiting on all embodiments of the inventive subject matter.

The inventive subject matter described herein provides a navigational system for a vehicle (e.g. aircraft) that includes a lighting assembly configured for emission of light (e.g. laser light). In one embodiment, the navigational system includes a lens array assembly that is configured to receive incoming light from the lighting assembly and change the direction of the incoming light received from the lighting assembly such that the outgoing light emanating from the lens array assembly is collimated in a first direction but diverges along a different, second direction. A scanning unit in alignment with the lighting assembly and is configured to direct the collimated beam in two orthogonal directions. The lighting assembly, the lens array assembly, and the scanning unit are configured to direct the light to form a visual beacon that guides navigation of a vehicle to a location.

In one embodiment, the lens array assembly includes a segmented micro optic lens array that redirects and controls the divergence of light (e.g., laser light) in a first direction (e.g., the horizontal direction), while collimating the light in a different, second direction (e.g., the vertical direction). The lens array assembly utilizes an array of N light sources (e.g., laser diodes), where the beams of light generated by the light sources is collimated in the second direction (e.g., the vertical direction) and diverges as 1/Nth of the full angular range in the first direction (e.g., the horizontal direction). The micro lens array assembly is configured to have progressively larger horizontal element decentration on lens elements (also referred to as lenslets) as one moves radially away from the center of the array. This causes the axial ray from light sources progressively farther from the center to be deflected at larger angles. By deflecting the beams towards the center, the required size of a scanning unit that reflects the light is greatly reduced, which makes the assembly compatible with the integrated photonic manufacturing approach on much smaller scales (e.g., sizes) than is currently available.

FIG. 1 illustrates one example of a navigational system 100 that generates light for operating as a beacon for navigating a vehicle, such as an aircraft 102. The system 100 includes a plurality of light sources in the form of lighting assemblies 104A and 104B to emit light 109 (e.g. laser light) through a plurality of lens array assemblies 106A and 106B. The navigational system 100 uses the lens array assemblies 106A and 106B to direct light 109 from the lighting assemblies 104A and 104B to scanning units 110A and 110B to form a visual beacon 112 having a predetermined shape, such as a square, rectangle, pyramid, rectilinear shape, curvilinear shape or other shape. The aircraft 102 can then use the visual beacon 112 for navigational purposes, such as determining where to land on a surface, as shown in FIG. 1. In other embodiments, aircraft can use the visual beacon 112 for alternate navigational purposes and/or aerobatic maneuvers, including but not limited to, landing or aerial refueling.

Figure 2A:
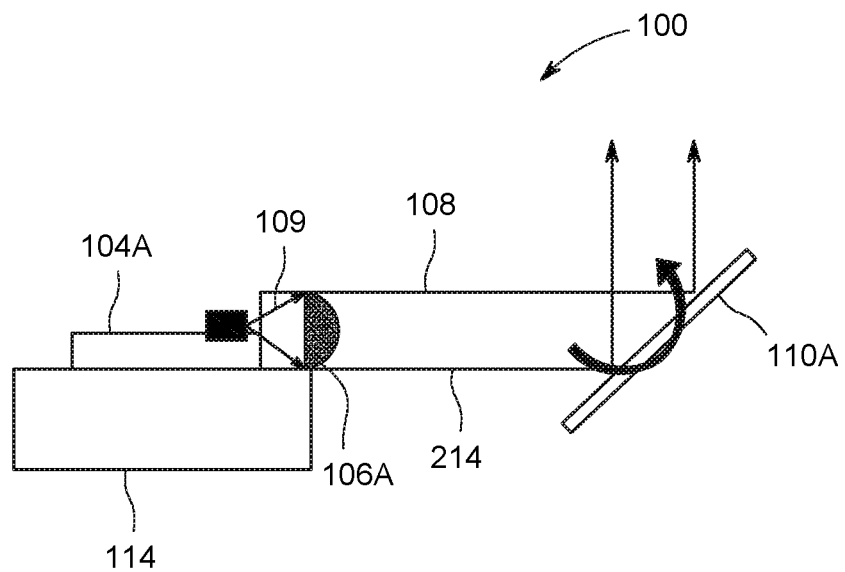
FIG. 2A illustrates a diagram of the navigational system according to an embodiment.
Figure 2B:
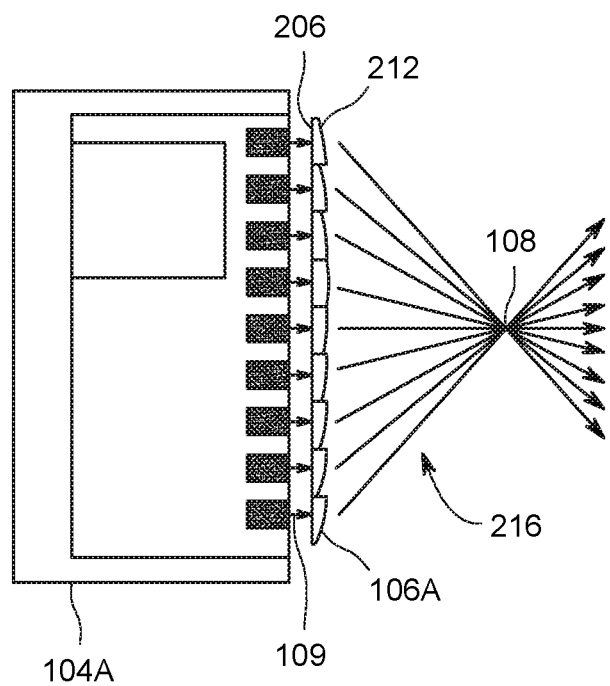
FIG. 2B illustrates a diagram of a lighting assembly according to an embodiment.
Figure 3:
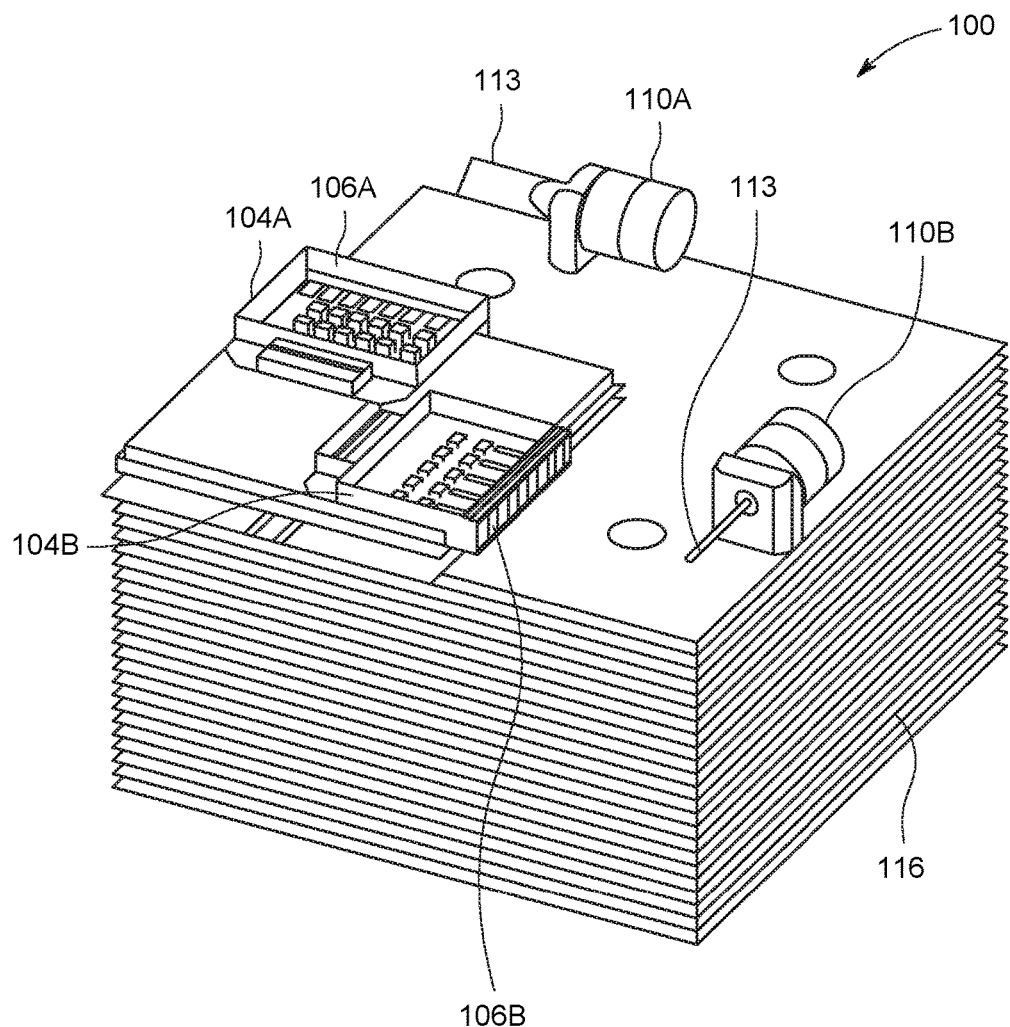
FIG. 3 illustrates a partial perspective view of the navigational system according to an embodiment.
Figure 4:
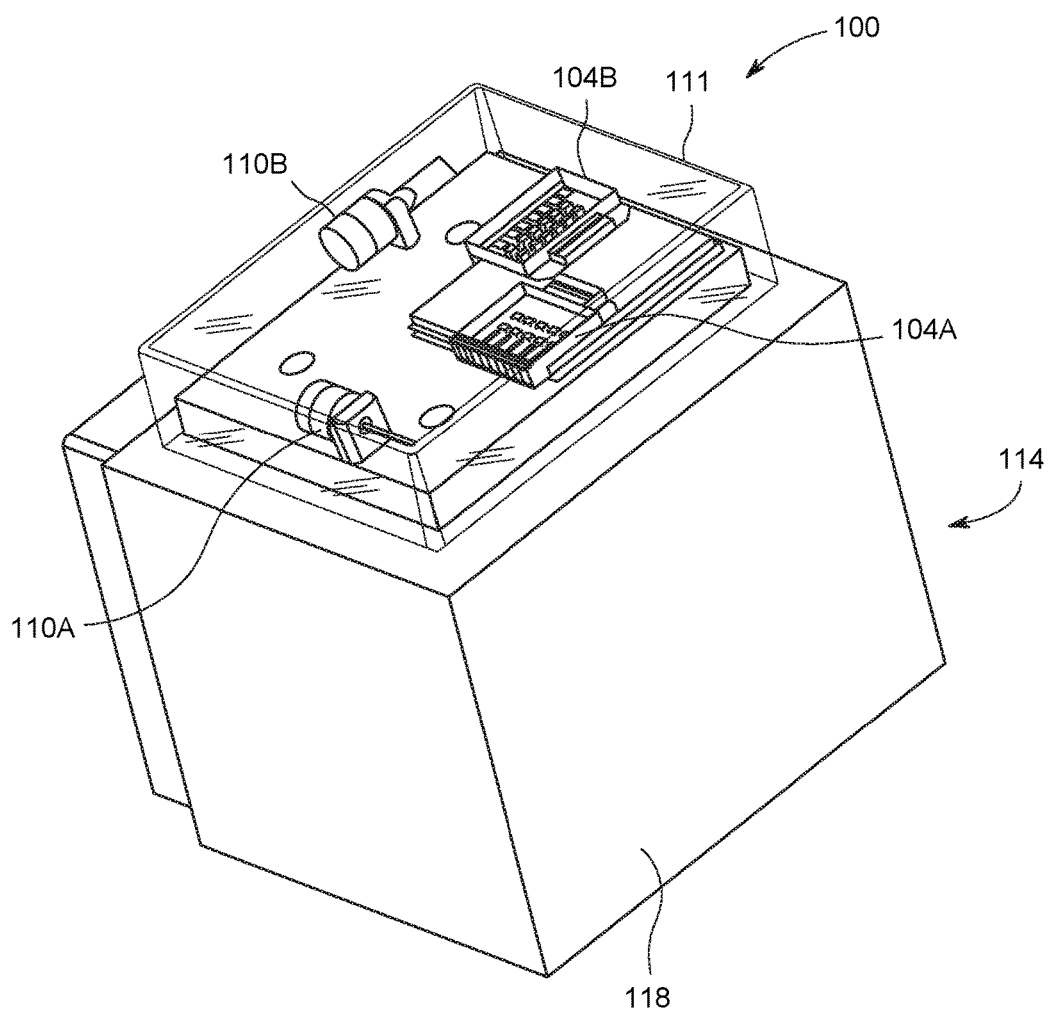
FIG. 4 illustrates a perspective view of the navigational system according to an embodiment.

FIGS. 2A and 2B illustrate diagrams of the navigational system 100 and the lighting assembly 104A. FIG. 3-4 illustrates a perspective view of the navigational system 100 according to an embodiment. Each lighting assembly 104A and 104B, corresponding lens array assembly 106A and 106B, and corresponding scanning units 110A and 110B generate at least a portion of the visual beacon 112, which is generally rectangular having a top portion 112A, a bottom portion 112B, and side portions 112C. The lighting assembly 104A, lens array 106A, and scanning unit 110A generate the top and bottom portions 112A and 112B. Similarly, the lighting assembly 104B, lens array assembly 106B, and scanning unit 106B generate the side portions 112C.

For example, the lighting assembly 104A emits light 109 (e.g. laser light) to the lens array assembly 106A (FIGS. 2A-2B). The incoming light 109 from the lighting assembly 104A is diffracted and refracted by the lens array assembly 106A to form a collimated light beam as outgoing light 108 that emanates from the lens array assembly 106A. The outgoing light or beam 108 is collimated in a first direction (e.g., vertical direction) such that all or substantially all (e.g., at least 95%, at least 97%, or at least 99%) of the outgoing light 108 is directed in a parallel, non-spreading or non-diverging direction when viewed along the vertical direction 214 (FIG. 2A). In one embodiment, the outgoing light 108 is vertically collimated such that the light is contained within (and does not substantially extend outside of) a dimension of no more than 3.4 millimeters. Alternatively, the outgoing light 108 can be contained in a smaller or larger dimension. Conversely, the lens array assembly 106A can diffract the incoming light 109 so that the outgoing light 108 diverges or spreads out in the second direction (e.g., an orthogonal or perpendicular direction, such as the horizontal direction 216 (FIG. 2B)). Different configurations of the lens array assembly 106 can diverge the portion of the incoming light 109 differently so that the beams of the outgoing light 108 from the lens array assembly is orientated in a different direction. In one embodiment, the outgoing light 108 diverges along a sixty-degree angle as the light emanates from the lens array assembly 106. Alternatively, the outgoing light 108 diverges along or within a smaller or larger angle. In alternate embodiments, another number, including one, and another configuration of lighting assemblies and lens array assemblies can be used to generate other shapes of the visual beacon 112.

Figure 5:
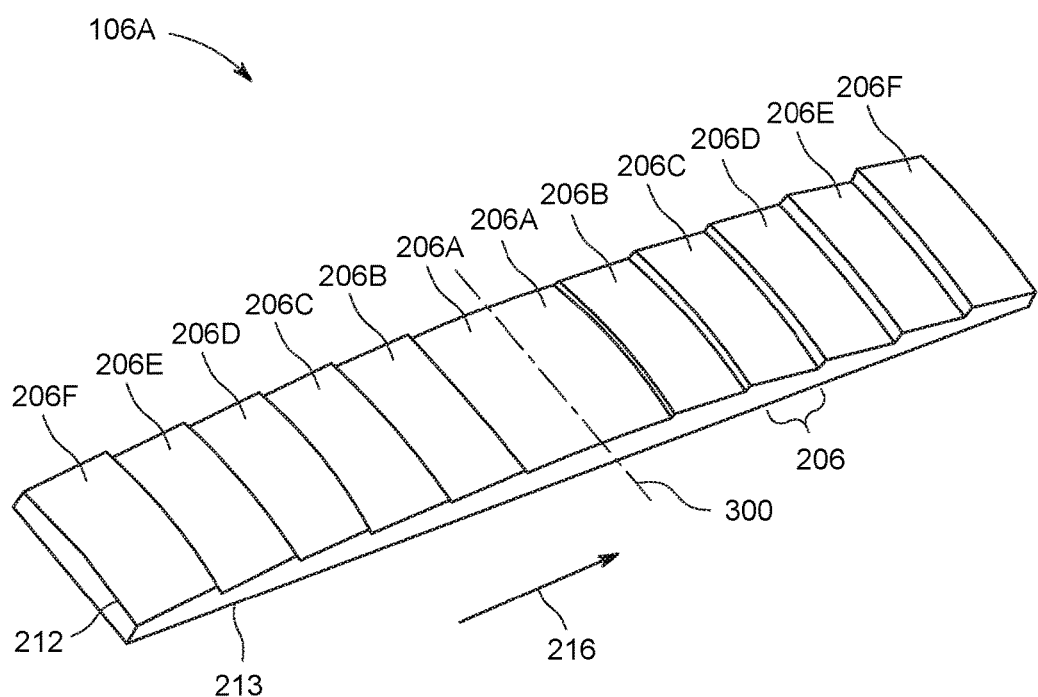
FIG. 5 illustrates a perspective view of a lens array assembly according to one embodiment.

FIG. 5 illustrates a perspective view of a lens array assembly 106A according to one embodiment. In the illustrated embodiment, the lens array assembly 106A includes twelve lens elements, or lenses (e.g., lens elements 206A-F). Alternatively, the lens array assembly 106A can include a different number of lens elements. Also, the lenses 206 can be formed as a single optic body or as separate optic bodies. The optic body may be a sheet or planar body of a material that receives, diffracts, and refracts light as described herein. In one embodiment, the optic body is a sheet of silicon. Alternatively, the optic body is formed from another material, such as a glass or polymer. The optic body is relatively thin prior to an etching process. For example, the optic body can be formed from a sheet of silicon that is no thicker than one millimeter. Alternatively, a thicker or thinner optic body can be used.

In one embodiment, a lens array assembly 106A is provided that includes plural lens elements 206 each configured to receive incoming light 109 from one or more light sources. The lens elements 206 include biconic refractive surfaces (also referred to as biconic refractive elements) on the front sides 212 of the lens elements 206 and diffractive surfaces (also referred to as diffractive elements) on the opposite, back sides 213 of the lens elements 206. The lens elements 206 are configured to change directions of the incoming light received from the lighting assembly 104A such that the outgoing light 108 emanating from the front surfaces or sides 212 of the lens elements 206 is collimated in a first direction but diverges along a different, second direction. For example, this outgoing light 108 may be collimated along or in a vertical direction 214 but diverge or spread out in an orthogonal direction, such as a horizontal direction 216 in which the lens elements 206 are arranged side-by-side.

The lens elements 206 can be arranged in different groups. For example, one group of lens elements 206 can include one of each of the lens elements 206A-F and another group of the lens elements 206 can include another one of each of the lens elements 206A-F. As a result, the lens elements 206 in the lens array assembly 106A are arranged in groups that are symmetrical about a center line 300 of the lens array assembly 106A. Each group or set of the lens elements 206A-F can create a different portion of the horizontally spread out outgoing light 108 shown in FIG. 2B. For example, another group or set of the lens elements 206A-F can create another outgoing light 108 shown in FIG. 2B, but that is on one side of the outgoing light 108 shown in FIG. 2B. The location of the lens elements 206 and the orientation of the different center directions of the outgoing light 108 from each lens element 206 can result in the portion of the outgoing light 108 from one or more lens elements 206 overlapping or crossing the portion of the outgoing light 108 from one or more other lens elements 206 before the focal point of the light, as shown in FIG. 2B. The combination of the vertically collimated outgoing light 214 (FIG. 2A) and the horizontally diverging or spread outgoing light 216 (FIG. 2B) can create a linear shape of light, such as one of several lines of light generated by the lighting system described above. As shown in FIG. 2B, the portion of the outgoing light 108 emanating from each lens elements 206A-F only partially overlaps (e.g., by three degrees or less) the portion of the outgoing light 108 emanating from the neighboring lens element 206 or each of the portions of the outgoing lights 108 emanating from the neighboring lens elements 206 on each side of the lens element 206. This overlap occurs after the portions of outgoing light 108 have crossed over each other.

Figure 6:
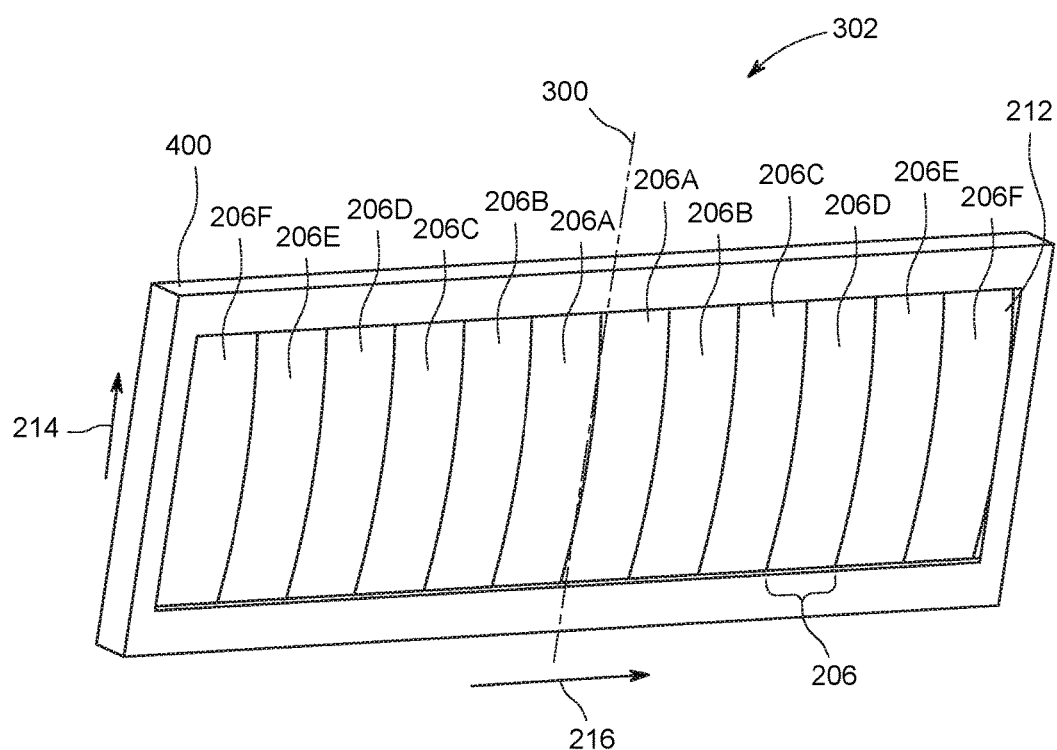
FIG. 6 illustrates a perspective view of a lens array assembly according to another embodiment.

FIG. 6 illustrates a perspective view of another embodiment of a lens array assembly 302. The lens array assembly 302 may be used in place of the lens array assembly 106A in the lighting assembly 104A shown in FIG. 2B. One difference between the lens array assemblies 106A, 302 shown in FIGS. 7 and 8 and the lens array assembly 302 is that the lens array assembly 302 includes a border or frame 400 extending around or encircling the lens elements 206 in the lens array assembly 302.

The lens array assemblies 106A, 106B, and 302 may be formed from silicon or another material. The lens array assemblies 106A, 106B, and 302 can be formed by applying a photoresist to a silicon body, exposing the photoresist to light (e.g., ultraviolet light) through a grayscale mask to form insoluble portions of the photoresist, and exposing the insoluble portions of the photoresist and portions of the silicon body outside of the insoluble portions of the photoresist. Each lens element 206 can be relatively small. For example, each lens element 206 can have a width dimension measured along the horizontal direction 216 that is no more than 2.2 millimeters and a height dimension measured along the vertical direction 214 that is no more than 3.4 millimeters. Optionally, the lens elements 206 may have a larger width dimension and/or height dimension.

The scanning units 110A and 110B (e.g. as a microelectromechanical system (MEMS) scanner mirror or a miniature galvanometer) are positioned in alignment with the lighting assembly 104A 104B to receive the outgoing light 108. The scanning unit 110A directs the outgoing light 108 in two orthogonal directions to form the top and bottom portions 112A and 112B of the visual beacon 112 (FIG. 1). The scanning unit 110B directs the outgoing light 108 in two orthogonal directions to form the side portions 112C of the visual beacon 112 (FIG. 1). For example, the scanning unit 110A can include a mirror 113 that oscillates in a periodic motion to direct the outgoing light 108 between the position of the top portion 112A and the position for the bottom portion 112B (FIG. 3). Similarly, the scanning unit 110B can include a mirror that oscillates in a periodic motion to direct the outgoing light 108 between the positions of the side portions 112C.

FIG. 3 illustrates a partial perspective view of the navigational 100 system according to an embodiment. The lighting assemblies 104A and 104B are operatively and mechanically mounted to a cooling device 114. The lighting assemblies 104A and 104B are positioned generally at a right angle relative to each other and aligned to emanate outgoing light to a corresponding scanning unit 110, such as a microelectromechanical system (MEMS) scanner mirror or a miniature galvanometer which is described in more detail below. Each scanning unit 110 is mounted to the cooling device 114 at a predetermined distance from the corresponding lighting assembly 104A and 104B. However, another number, including one, or another configuration of lighting assemblies 104 and corresponding scanning units 110 can be used to direct light into the requisite visual beacon. A housing 111 mounts to the cooling device 114 to encase and hermetically seal the lighting assemblies 104 and scanning units 110. The housing 111 is preferably made from a transparent material that allows the beam 108 to pass through without interference.

The cooling device 114 regulates the temperature of the laser to provide extended continuous operation. For stable operation, the temperature of the lighting assemblies 104 must be tightly regulated. During operation, the lighting assemblies 104 produce a significant amount of heat, which must be removed to maintain a proper temperature and stable operation. As shown in FIGS. 3-4, the cooling device 114 is a vapor chamber heatsink 116 that transfers heat from the lightening assemblies 104 to a thermoelectric cooler 118, which transfers heat to the ambient environment outside the thermoelectric cooler 118. The heat sink 116 and cooler 118 should have sufficient heat transfer capacity to dissipate a larger amount of heat than the lighting assembles 104 can generate. This allows the lighting assemblies 104 to run below their minimum temperature requirement and operate continuously. If either the heat sink 116 or the cooler 118 does not provide sufficient heat transfer capacity, heat will build up in the lighting assemblies and destabilize. Although the capability to run continuously may be preferred, configurations that provide limited times of operation, such as hours or even tens of minutes, may also be used. In the embodiment of FIGS. 3-4, the cooling device includes both a primary heat sink and a secondary heat sink to transfer heat from the lighting assemblies 104. However, any suitable number, including one, or configuration can be used to provide the requisite mass and heat transfer. In addition, any type of cooling device can be used, such as mercury cooling, finned heat sinks, micro channel cooling, and the like.

Figure 7:
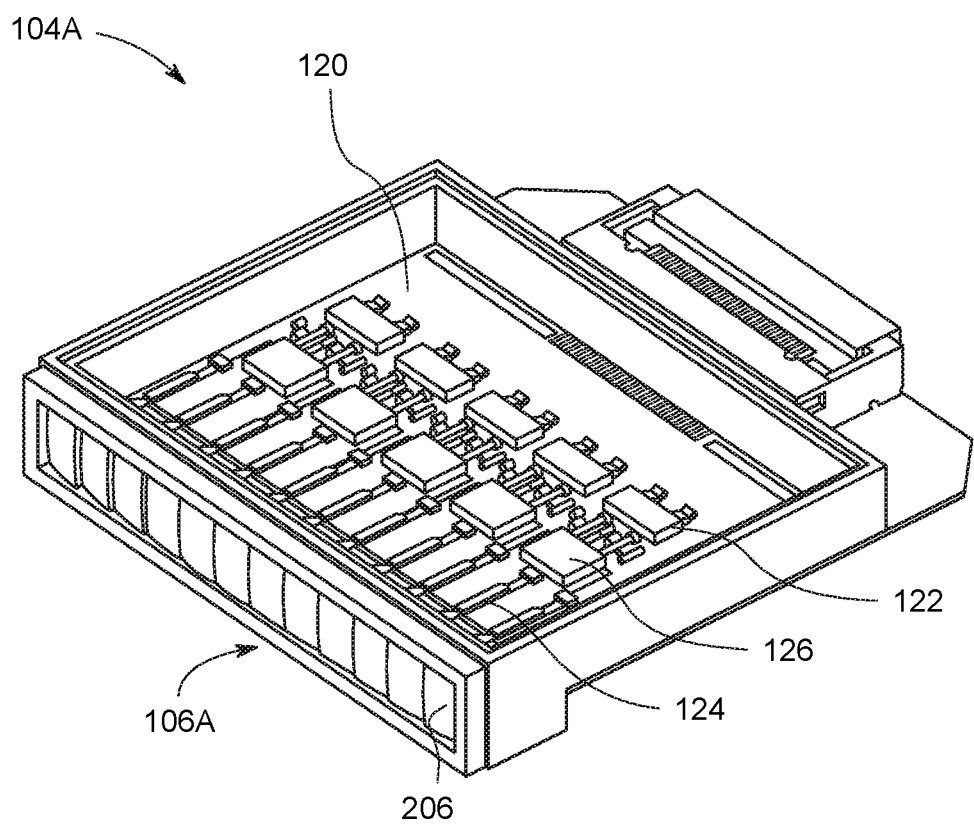
FIG. 7 illustrates a front perspective view of the lighting assembly according to an embodiment.
Figure 8:
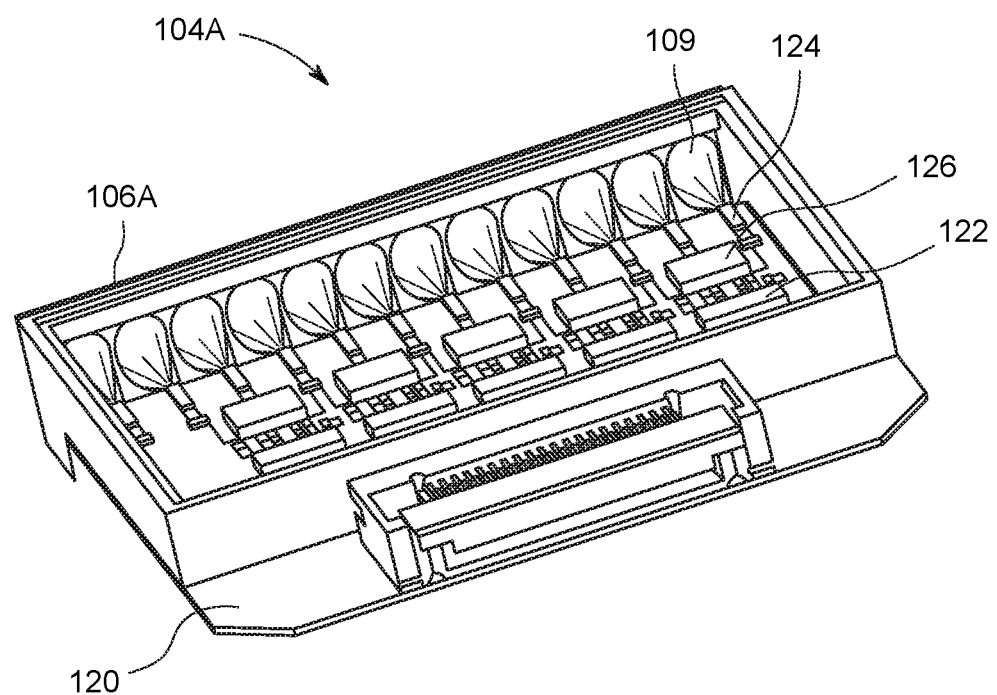
FIG. 8 illustrates a rear perspective view of the lighting assembly according to an embodiment.

FIG. 7-8 illustrates a front and rear perspective view of the lighting assembly 104A according to an embodiment. The lighting assembly 104A includes a substrate 120 operatively and mechanically connected with a controller or driver 122, plurality of laser diodes 124, a plurality of photodiodes 126, and the lens array assembly 106A. The controller 122 is operatively connected to the laser diodes 124, photodiodes 126, and scanning units 110 to control the operations of the navigational system 100.

The controller 122 is an integrated circuit that may include one or more computer processors. The controller 122 is electrically connected to the plurality of laser diodes 124, either in series or parallel, to provide power for generating light from the laser diodes 124. The supply of power from the controller 122 is regulated to prevent damage to the laser diodes 124 from receiving too much power or other irregularities. For example, if one of the diodes fails and becomes an electrical short, the controller will experience a sudden decrease in its load voltage.

The illustrated embodiment includes twelve laser diodes 124 electrically connected to twelve photodiodes 126. Each laser diode 124 preferably has a 0.8 W output power and emits a 1570 nanometer wavelength. However, another suitable laser diode configuration can be used. The laser diodes 124 can all generate light having the same or substantially the same (e.g., within 3%) wavelength, such as 1570 nanometers. This light is received by the lens elements 206 into or through a back surface or side 210 of each lens element 206. The light that is generated by the laser diodes 124 and received by the lens elements 206 can be referred to as incoming light. The light passes through the lens elements 206, is collimated, diffracted, and/or refracted by the lens elements 206, and exits or emanates from opposite front surfaces or sides 212 of the lens elements 206 as outgoing light in a substantially linear line-shaped beam 108. The controller 122 can control the light output by each laser diode 124. Optionally, another type of laser diode 124 can be used, or at least one of the laser diodes 124 can generate light that is received by two or more of the lens elements 206.

The controller 122 electrically connects to the plurality of photodiodes 126, which detect the optical power of laser diodes 124 and regulate the power to the laser diodes 124 so the laser diodes 124 do not go above a certain predetermined threshold to prevent damage. Alternatively, photodiodes 126 can be replaced with other suitable photodetectors including, but not limited to, avalanche photodiodes, solid state photodetectors, or photomultipliers. Based on signals from the photodiodes 126, the controller 122 can control the light output of the laser diodes and maintain the appropriate power level, intensity level, and/or other parameters.

The controller 122 electrically connects with the scanning unit 110A (e.g. as a microelectromechanical system (MEMS) scanner mirror or a miniature galvanometer) to direct the outgoing light 108 in two orthogonal directions to form the top and bottom portions 112A and 112B of the visual beacon 112 (FIG. 1). For example, the controller 112 can oscillate the mirror 113 in a periodic motion to direct the outgoing light 108 between the position of the top portion 112A and the position for the bottom portion 112B (FIG. 3). Similarly, the controller 112 can oscillate the mirror 113 of the scanning unit 110B in a periodic motion to direct the outgoing light 108 between the positions of the side portions 112C.

The controller 122 can also electrically connect to the cooling device 114 to monitor and regulate the temperature of the laser diodes 124 and other components to prevent over or under temperature conditions during operation.

The controller 122, plurality of laser diodes 124, and plurality of photodiodes are mounted to the substrate 120. The substrate 120 is an optical bench preferably made from a material with a high heat conductivity to aid the transfer of heat transfer from the mounted components to the cooling device 114. In addition, the substrate should be substantially flat and free of warpage, maintaining the angular orientation and vertical alignment between the laser diodes, the lens array assembly, and the corresponding scanning unit 110. For example, the substrate can be made from a ceramic or ceramic composite material, such as an Aluminum Nitride base material. Other possible choices of thermally conductive materials for the substrate could be beryllium oxide (BeO) or translucent cubic boron nitride (T c-BN). Non-ceramic materials, such as thermoset resins, can be also used, unless organic materials are to be avoided to prevent contamination of the devices in the package. Alternatively, the substrate can be a printed circuit board.

The components of the lighting system 104 can be mounted to the substrate 120 with surface mount technology that allows for pick and place type assembly, such as flip chip. This allows for faster assembly, tighter alignment tolerances, and higher yields.

In an alternate embodiment, the controller 122 is formed within the substrate 120 that the other electrical components are mounted to. This allows for high speed modulation of the high current laser diodes. The stray inductance and capacitance of the electrical interconnects can be greatly reduced, allowing for higher data rate transmission of navigation data to incoming aircraft.

Figure 9:
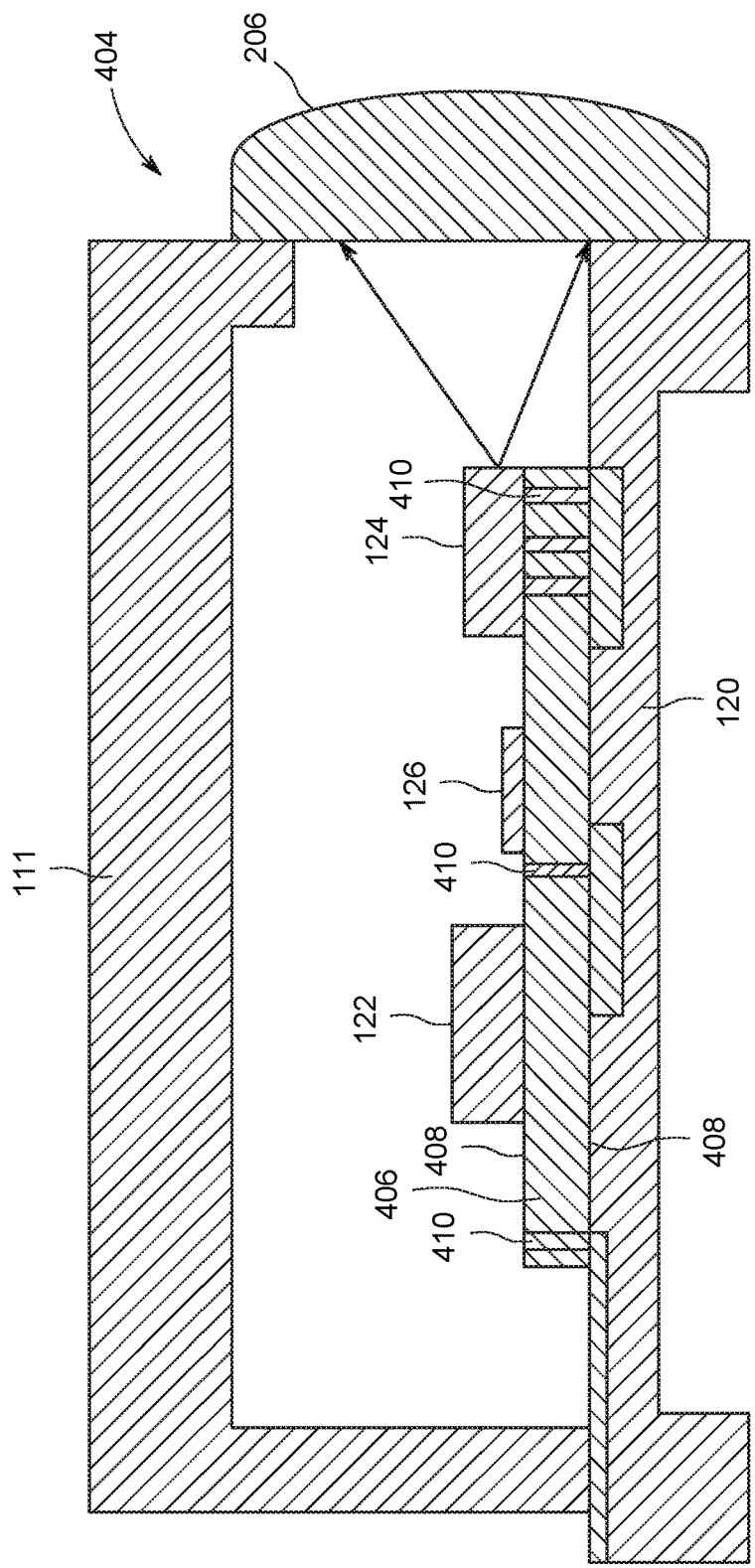
FIG. 9 illustrates a cross section view of an alternate embodiment of a lighting assembly.

FIG. 9 illustrates a section view of a lighting assembly 404 according to an alternate embodiment, which is similar to the embodiment of the lighting assembly 104A of FIGS. 7-8, including the substrate 120, the controller 122, the plurality of laser diodes 124, the plurality of photo diodes 126, and the lens array assembly 206. However, the lighting assembly 404 also includes an interposer 406 operatively and mechanically connected between the substrate 120 and the controller 122, plurality of laser diodes 124, and the plurality of photodiodes 126. The interposer 406 is a printed circuit board preferably made from a material with a high heat conductivity to aid the transfer of heat transfer from the mounted components to the cooling device 114. In addition, the substrate should be substantially flat and free of warpage, maintaining the angular orientation and vertical alignment between the laser diodes, the lens array assembly, and the corresponding scanning unit 110. For example, the interposer 406 can be made from silicon or a ceramic or ceramic composite material, such as an Aluminum Nitride base material. Other possible choices of thermally conductive materials for the substrate could be beryllium oxide (BeO) or translucent cubic boron nitride (T c-BN). Non-ceramic materials, such as thermoset resins, can be also used, unless organic materials are to be avoided to prevent contamination of the devices in the package.

The interposer 406 includes upper and lower board surfaces 408 that face in opposite directions and electrical contacts 410 coupled to one another through the interposer 406 with traces (not shown). In the illustrated embodiment, the electrical contacts 410 are pre-defined bond pads. The interposer may also include a thermal management layer (not shown) 408 of the interposer 406, such as a passive cooling device or an active cooling device. An opto-mechanical housing 111 mounts to the substrate 120 to enclose lighting assemblies 404.

Figure 10:
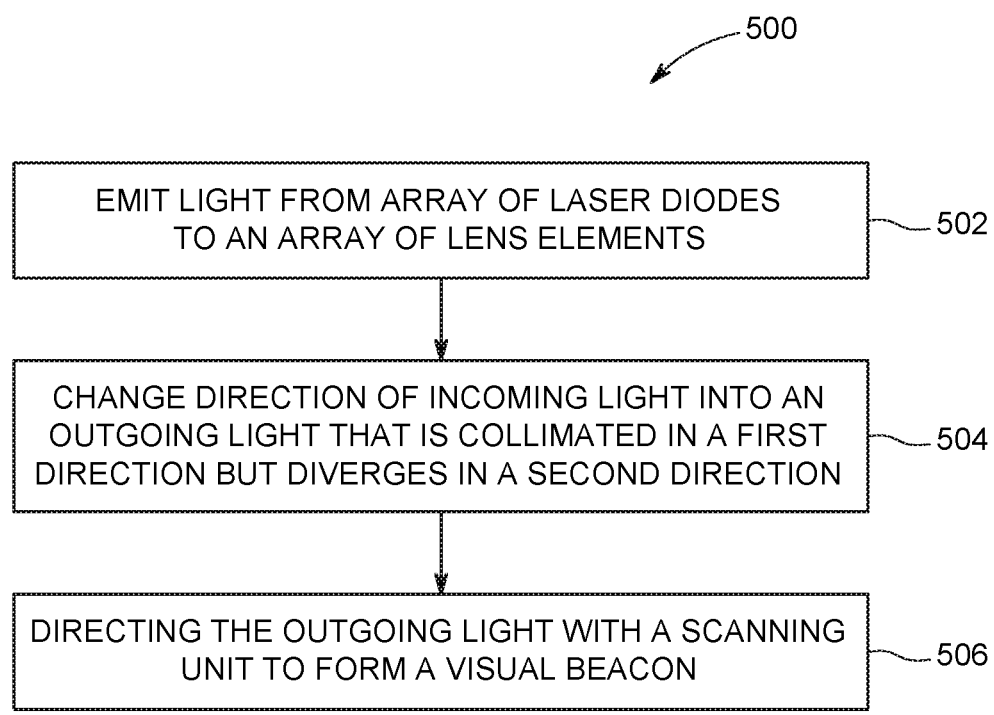
FIG. 10 illustrates a flowchart of one embodiment of a method for operating the navigational system.

FIG. 10 illustrates a flowchart of one embodiment of a method for operating the navigational system 500. At 502, a light emits from an array of laser diodes 124 to an array of lens elements 206. At 504, the array of lens elements 206 changes the direction of the incoming light 109 into an outgoing light 108 that is collimated in a first direction 214 but diverges along a different, second direction 216. At 504, each scanning unit 110A and 110B in alignment with the outgoing light 108 directs the light to in two orthogonal beams to form a visual beacon 112 that guides navigation of a vehicle 102 to a location.

Figure 11:
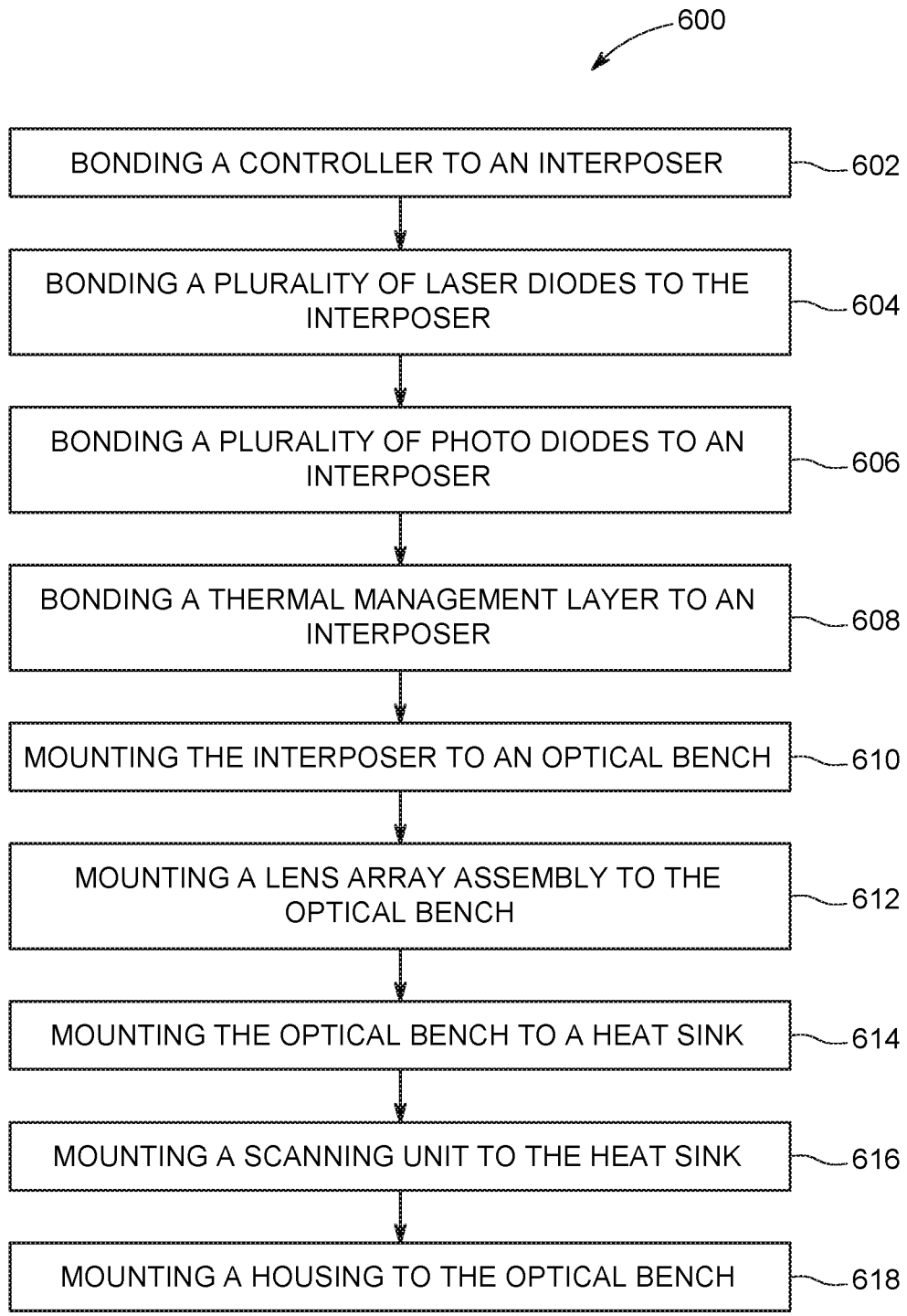
FIG. 11 illustrates a flowchart of one embodiment of a method of assembling the navigational system.

FIG. 11 illustrates a flowchart of one embodiment of a method for assembling a navigational system 600. At 602, a controller is bonded to an interposer having electrical contacts coupled by traces. At 604, a plurality of laser diodes is bonded to the interposer and electrically connected through the electrical contacts and traces to the controller. At 606, a plurality of photo diodes is bonded to the interposer and electrically connected through the electrical contacts and traces to the controller. At 608, a thermal management layer is bonded to the interposer. At 610, the interposer is mounted to an optical bench. At 612, a lens array assembly is mounted to the optical bench, such as with a pick and place process, to receive incoming light from the laser diode and change the direction of the incoming light received from the laser diode. The outgoing light emanating from the lens array assembly is a beam collimated in a first direction but diverging along a different second direction. At 614, the optical bench mounts to a heat sink or cooling device. At 616, a scanning unit mounts to the heat sink in alignment with the lens array assembly for direction of the collimated beam in two orthogonal directions. The scanning unit is electrically connected to the controller. At 618, the lighting assembly is at least partially covered by an opto-mechanical housing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, communication unit, control system, etc.) may be implemented in a single piece of hardware (for example, general-purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

Changes can be made in the above constructions without departing from the scope of the disclosure, it is intended that all matter contained in the above description or shown in the accompanying drawings shall be interpreted as illustrative and not in a limiting sense.

What is claimed is:

1. A navigation system for a vehicle, the navigation system comprising:
a lighting assembly that includes several light sources each configured to emit light;
a single body lens array formed into plural lenslets, each lenslet configured to receive the light that is emitted from a different light source in the light sources of the lighting assembly, the single body lens array having diffractive surfaces on a back side of the single body lens array that faces the light sources and biconic surfaces on an opposite front side of the single body lens array that faces away from the light sources, the lenslets of the single body lens array configured to change the light received from the light sources in the lighting assembly to a collimated beam by collimating the light in a collimated direction and diverging the light along a different, diverging direction between the diffractive surfaces of the lenslets and the opposite biconic surfaces of the lenslets; and
a scanning unit in alignment with the lighting assembly and configured to direct the collimated beam in two orthogonal directions; and
wherein the lighting assembly, the lens array and the scanning unit are configured to direct the collimated beam to form a visual beacon that guides navigation of the vehicle.

2. The navigation system of claim 1, wherein the light sources of the lighting assembly each include:
a laser diode configured for emission of the light; and
a photo diode electrically connected to the laser diode, and further comprising:
a controller electrically connected to the laser diodes, the photo diodes, and the scanning unit; and
wherein each of the lenslets in the lens array is aligned with a different laser diode of the laser diodes in the lighting assembly to receive the light that is emitted by the corresponding laser diode.

3. The navigation system of claim 1, further comprising:
an optical bench; and
a plurality of the lighting assemblies mounted to the optical bench and configured for emission of the light.

4. The navigation system of claim 3, wherein the lenslets in the lens array are disposed side-by-side along the diverging direction.

5. The navigation system of claim 1, wherein each of the lenslets is configured to form a different diverging portion of the collimated beam.

6. The navigation system of claim 5, wherein each of the lenslets of the lens array is configured to form the diverging portion of the collimated beam such that the diverging portion of the collimated beam that emanates from each of the lenslets only partially overlaps the diverging portion of the collimated beam emanating from at least one neighboring lenslet of the lenslets in the lens array.

7. The navigation system of claim 1, further comprising a cooling device configured to cool the lighting assembly.

8. A vehicle navigation system comprising:
laser diodes configured for emission of light;
a controller electrically connected to the laser diodes to control operation of the laser diodes; and
a lens array having several lenslets formed in a single body and configured to receive the light emitted by the laser diodes, the lenslets configured to change directions of the light received from the laser diodes by collimating the light in a first direction and diverging the light in a different, second direction as the light passes through the single body of the lens array; wherein each lenslet of the lenslets in the lens array includes a diffractive surface on a back side of the lenslet that faces the laser diodes and a biconic surface on an opposite front side of the lenslet that faces away from the laser diode.

9. The vehicle navigation system of claim 8, further comprising:
a scanning unit electrically connected to the controller, positioned in alignment with the lens array, and configured to direct the light that is collimated and diverged by the lens array to form a visual beacon that guides navigation of the vehicle to a location.

10. The vehicle navigation system of claim 8, wherein each lenslet of the lenslets in the lens array receives the light emitted by a different laser diode of the laser diodes.

11. The vehicle navigation system of claim 8, wherein each lenslet of the lenslets of the lens array is configured to form a different portion of outgoing light from the lens array such that the portion of the outgoing light emanating from each of the lenslets only partially overlaps the portion of the outgoing light emanating from at least one neighboring lenslet of the lenslets in the lens array.

12. The vehicle navigation system of claim 8, wherein the lenslets are disposed side-by-side along the second direction in the lens array.

13. The vehicle navigation system of claim 8, further comprising:
a cooling device operatively connected to the laser diodes to cool the laser diodes.

14. The vehicle navigation system of claim 8, wherein the controller includes a complementary metal-oxide-semiconductor circuit located in an optical bench that supports the lens array and the laser diodes.

15. A vehicle navigation system comprising:
horizontal and vertical lighting assemblies each including:
laser diodes configured to generate light; and
a single body lens array forming plural lenslets disposed side-by-side along a diverging direction, the lenslets of the single body lens array having diffractive surfaces along a back side of the lens array that faces the laser diodes and that directly receives the light from the laser diodes, the lenslets of the single body lens array also having biconic surfaces along an opposite front side of the lens array that faces away from the laser diodes, wherein the lenslets are configured to receive the light generated by the laser diodes and to collimate the light along a collimating direction and to diverge the light along the diverging direction to form a line of emanating light that exits from the single body lens array through the front side of the lens array, the lenslets diverging the light along the diverging direction by different amounts based on locations of the lenslets relative to a center of the lens array, wherein a portion of the line of emanating light that exits the single body lens array from each of the lenslets does not completely overlap a remainder of the emanating light that exits the single body lens array from all other lenslets of the lenslets in the lens array; and
horizontal and vertical scanning units each including a mirror facing a different lighting assembly of the lighting assemblies, the horizontal scanning unit configured to move the mirror of the horizontal scanning unit to move the line of emanating light exiting from the horizontal lighting assembly back-and-forth between a top position and a bottom position of a navigational beacon, the vertical scanning unit configured to move the mirror of the vertical scanning unit to move the line of emanating light exiting from the vertical lighting assembly back-and-forth between a first side position and a second side position of the navigational beacon, wherein the navigational beacon that is formed guides movement of a vehicle to a location.

* * * * *